(12) United States Patent
Xu et al.

(10) Patent No.: US 11,196,435 B1
(45) Date of Patent: Dec. 7, 2021

(54) ANTI-ALIASING TECHNIQUES FOR TIME-TO-DIGITAL CONVERTERS

(71) Applicant: Apple Inc., Cupertino, CA (US)

(72) Inventors: Pangjie Xu, San Jose, CA (US); Jelam K. Parekh, Milpitas, CA (US); Mohamed H. Abu-Rahma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/014,536

(22) Filed: Sep. 8, 2020

(51) Int. Cl.
*H03M 1/06* (2006.01)
*G04F 10/00* (2006.01)
*H03M 7/16* (2006.01)

(52) U.S. Cl.
CPC ........ *H03M 1/0629* (2013.01); *G04F 10/005* (2013.01); *H03M 7/165* (2013.01)

(58) Field of Classification Search
CPC ...... H03M 1/0629; H03M 7/165; H03M 1/06; H03M 1/1023; G04F 10/005
USPC .............................................. 341/118, 50, 51
See application file for complete search history.

(56) References Cited

U.S. PATENT DOCUMENTS

| | | | |
|---|---|---|---|
| 5,977,899 A * | 11/1999 | Adams | H03M 3/50 341/143 |
| 8,669,794 B2 | 3/2014 | Park et al. | |
| 8,717,060 B2 | 5/2014 | Lee | |
| 8,738,195 B2 | 5/2014 | Aldridge et al. | |
| 9,543,970 B2 * | 1/2017 | Liu | H03L 7/085 |
| 9,588,497 B1 * | 3/2017 | Monk | H03L 7/093 |
| 9,602,120 B1 | 3/2017 | Plouchart et al. | |
| 9,735,679 B2 * | 8/2017 | Holzmann | H02M 3/157 |

OTHER PUBLICATIONS

Shang et al., "Low Overhead and Fast Reaction Adaptive Clocking System for Voltage Droop Tolerance", Chinese Journal of Electronics, May 2019, pp. 503-507, vol. 28, No. 3.

* cited by examiner

*Primary Examiner* — Jean B Jeanglaude
(74) *Attorney, Agent, or Firm* — Kowert Hood Munyon Rankin and Goetzel PC; Rory D. Rankin (57) ABSTRACT

Systems, apparatuses, and methods for implementing an anti-aliasing technique for a time-to-digital converter are described. A pulse generator generates a pulse with a width that is representative of a voltage level of a supply voltage. A buffer chain receives the pulse from the pulse generator. A first sum is calculated by adding together a number of one bits in a first portion of the buffer chain. Also, a second sum is calculated by adding together a number of one bits in a second portion of the buffer chain. Then, a third sum is calculated by adding the first sum to the second sum if the first sum is saturated. Otherwise, the third sum is equal to the first sum if the first sum is not saturated. The third sum is used as a representation of the voltage level of the supply voltage.

20 Claims, 8 Drawing Sheets

ANTI-ALIASING TECHNIQUES FOR TIME-TO-DIGITAL CONVERTERS

BACKGROUND

Technical Field

Embodiments described herein relate to the field of circuits and, more particularly, to preventing aliasing with time-to-digital converters.

Description of the Related Art

Digital electronic systems utilize a number of different types of circuits for controlling the processing and movement of information. This information may be encoded in a variety of different types of formats, such as thermometer-encoded data. Thermometer-encoded data (or thermometer codes) include a series of 1's (or one-bits) followed by 0's (or zero-bits), with the length of the series of 1's serving as a measure of a particular attribute (e.g., supply voltage). Thermometer-encoded data can be generated to capture the state of a device or a particular condition of a set of operating conditions. Operating conditions can change for a wide variety of electronic devices. For example, a supply voltage can fluctuate during operation, and this can impact the operation, performance, and functionality of an electronic device.

It is common for thermometer-encoded data to be converted to binary-encoded data by a time-to-digital converter for use by digital processing circuitry. When converting a thermometer code to a binary code, aliasing in the thermometer code can cause errors in the resultant binary code. In some cases, this aliasing is caused by more than one pulse of the thermometer code being captured during the sampling window.

SUMMARY

Systems, apparatuses, and methods for implementing an anti-aliasing time-to-digital converter (TDC) are contemplated. In one embodiment, a TDC is implemented with an N-bit buffer chain, wherein N is a positive integer, and wherein the value of N varies according to the embodiment. The TDC receives a digital pulse signal and shifts the digital pulse signal into the N-bit buffer chain. Next, the TDC generates a sum of the number of 1 bits in the N-bit buffer chain. Then, the sum is converted into a digital code which represents a measure of a particular metric (e.g., a voltage level of a power supply).

In one embodiment, the TDC detects the earliest failure point (i.e., transition from 1 to 0) of the received pulse signal. If the earliest failure point is less than or equal to the midpoint of the N-bit buffer chain, then the TDC does not count any of the 1's from the upper half of the N-bit buffer chain when generating a corresponding sum of 1's. Otherwise, if the failure point is greater than the midpoint of the N-bit buffer chain, then the TDC includes all of the 1's from both the upper half and the lower half of the buffer chain when generating the corresponding sum. In one embodiment, the sum that is generated represents the voltage level of a power supply. In this embodiment, if a voltage droop is detected based on the digital code generated by the TDC, corrective action can be taken. For example, in one embodiment, the frequency of a clock which is being supplied to one or more circuits can be decreased in response to detecting a voltage droop.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
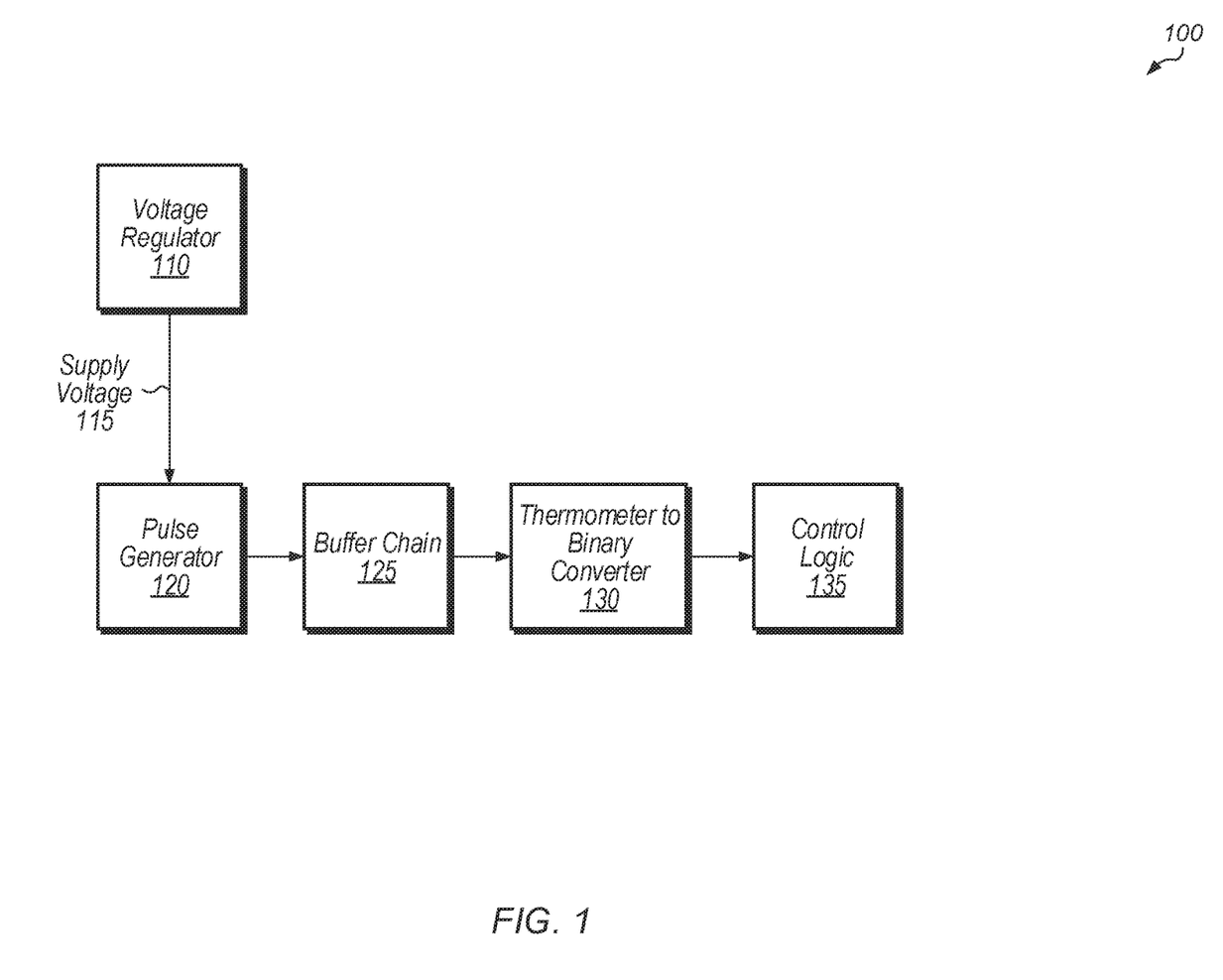
FIG. 1 is a generalized block diagram of one embodiment of an integrated circuit.

Referring to FIG. 1, a block diagram of one embodiment of an integrated circuit (IC) 100 is shown. In one embodiment, IC 100 includes voltage regulator 110, pulse generator 120, buffer chain 125, thermometer-to-binary converter 130, and control logic 135. It should be understood that IC 100 may also include any number of other components (e.g., other voltage regulators, memory devices, processing elements) which are not shown to avoid obscuring the figure. Also, although only a single instance of voltage regulator 110, pulse generator 120, buffer chain 125, thermometer-to-binary converter 130, and control logic 135 are shown in FIG. 1, it should be understood that IC 100 may include multiple instances of voltage regulator 110, pulse generator 120, buffer chain 125, thermometer-to-binary converter 130, and/or control logic 135.

Voltage regulator 110 generates supply voltage 115 which is supplied to pulse generator 120. Voltage regulator 110 may also provide supply voltage 115 and/or other supply voltages to other components. In one embodiment, pulse generator 120 generates pulses which have a width that is dependent on the voltage level of supply voltage 115. The pulses may be referred to as a thermometer code representation of supply voltage 115. The pulses are shifted into buffer chain 125 which includes a chain of serially-coupled delay elements connected to a chain of flip-flops. Thermometer-to-binary converter 130 converts the thermometer code into a binary code which is provided to control logic 135. In one embodiment, if control logic 135 detects a voltage droop for supply voltage 115, control logic 135 may cause corrective action (e.g., clock frequency reduction) to be taken. For example, in this embodiment, control logic 135 may be coupled to a phase-locked loop (PLL) (not shown) that generates a clock signal for one or more components. More details on the implementation of the different components of IC 100 will be provided throughout the remainder of this disclosure.

Figure 2:
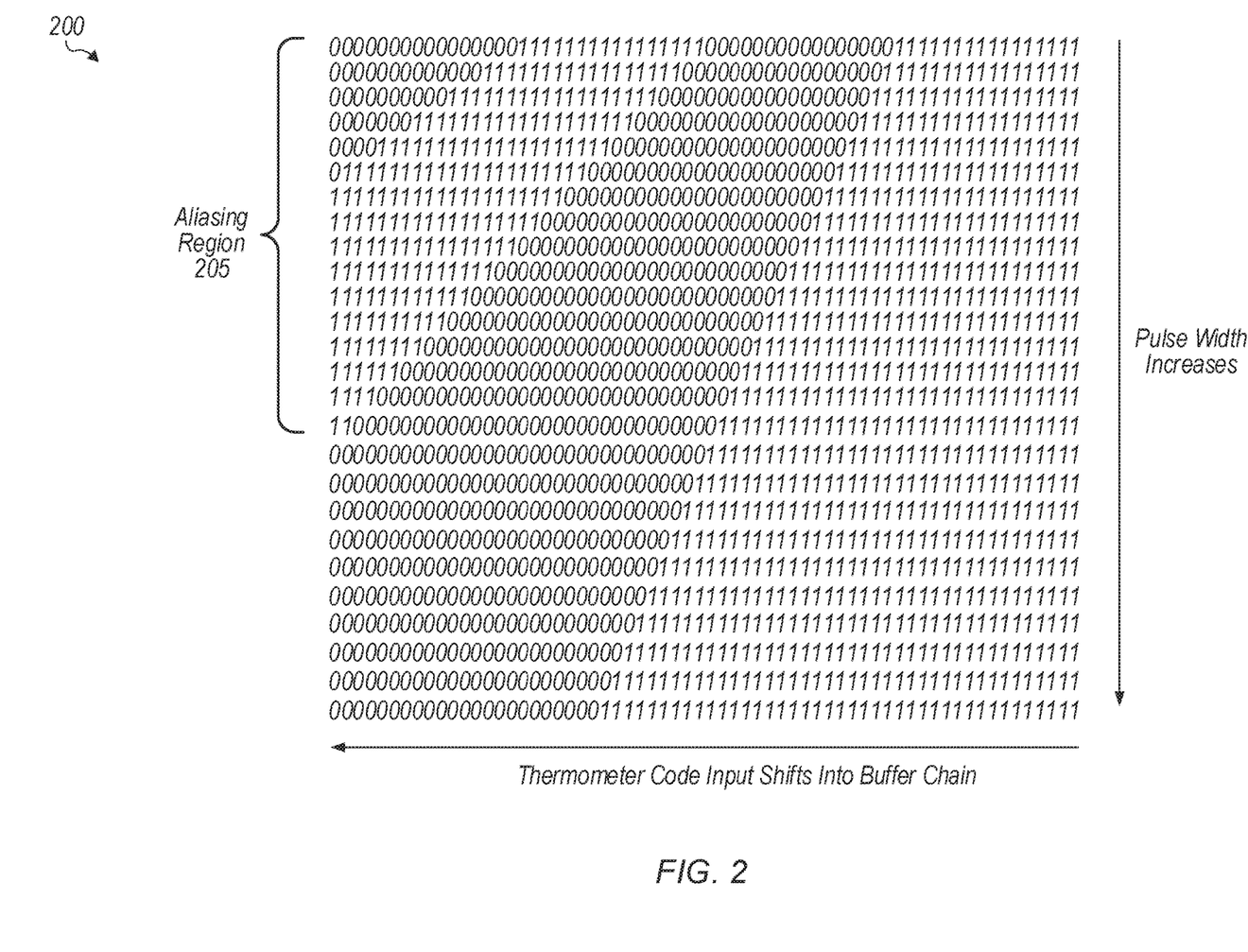
FIG. 2 is a diagram of one embodiment of different thermometer codes.

Turning now to FIG. 2, a diagram 200 of one embodiment of different thermometer codes is shown. Diagram 200 illustrates examples of different 64-bit thermometer codes. It is assumed for the purposes of this discussion that the thermometer codes are being shifted in from the right-side of diagram 200. In one embodiment, the thermometer codes correspond to a voltage level of a supply voltage. The thermometer codes change as the voltage level increases, which is being depicted for the rows of diagram 200 moving from top to bottom.

Whenever there is more than one pulse captured in the 64-bit window shown in diagram 200, the result of adding all 1's in the row will result in aliasing errors. This is illustrated by aliasing region 205, which is shown for the upper rows of diagram 200. For these upper rows, there is a pulse of 1's followed by 0's and then followed by another pulse of 1's. For these upper rows, a naïve implementation would involve adding up all of the 1's in the 64-bit thermometer code. However, this would result in an inaccurate value for the pulse width. The techniques described herein are able to convert thermometer codes into the proper binary codes even for those thermometer codes shown in aliasing region 205. It should be understood that the example of the 64-bit thermometer codes shown in diagram 200 are used for illustrative purposes. Thermometer codes may have any number of bits, with the number of bits varying from embodiment to embodiment.

Figure 3:
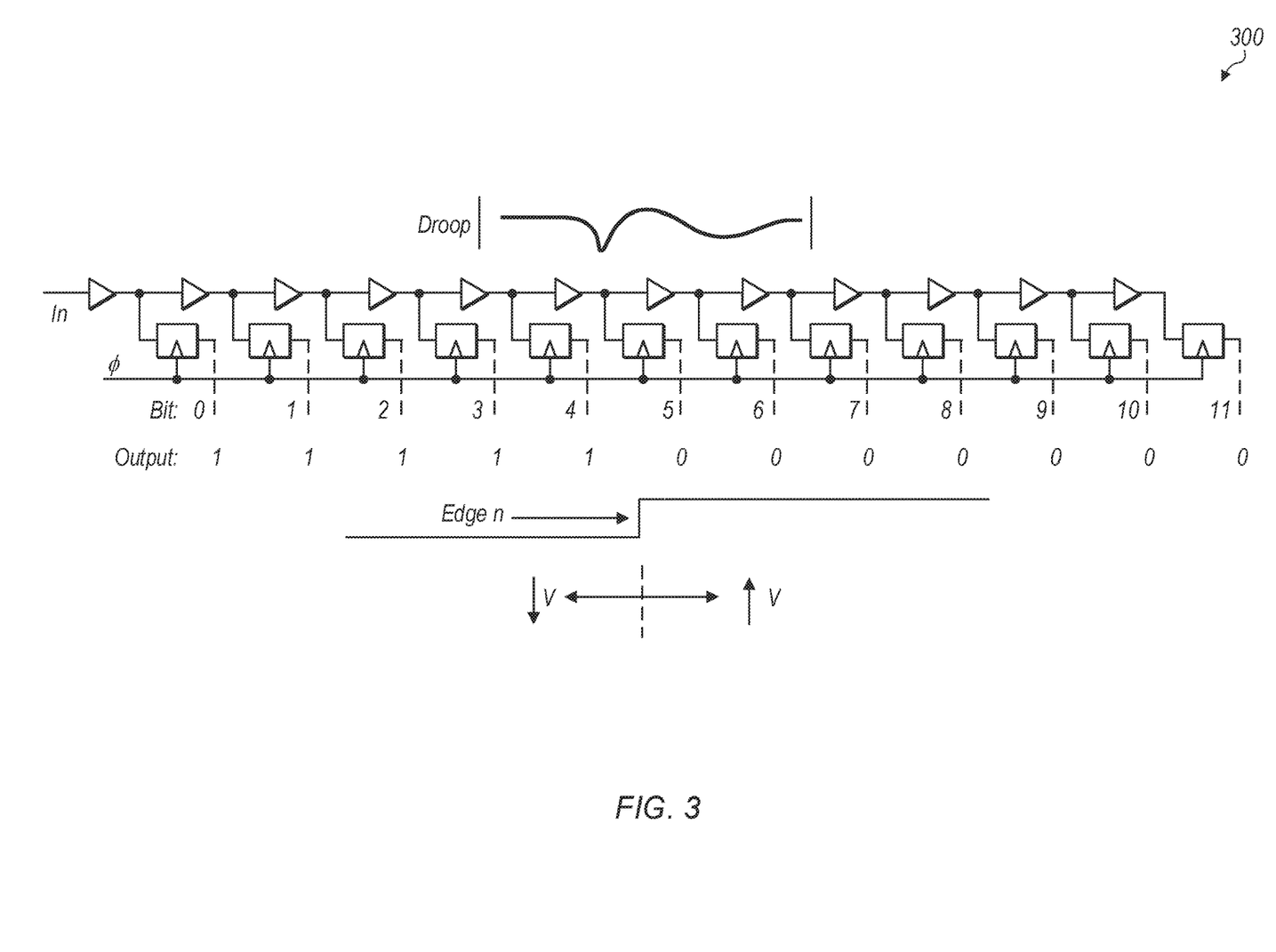
FIG. 3 is a block diagram of one embodiment of a time-to-digital converter.

Referring now to FIG. 3, a block diagram of one embodiment of a time-to-digital converter (TDC) 300 is shown. One example of a time-to-digital converter (TDC) 300 with a chain of serial-connected delay elements coupled to flip-flops is shown in FIG. 3. In one embodiment, an input pulse is received and coupled to the input of TDC 300. While a chain of 12 delay elements and flip-flops are shown in FIG. 3, it should be understood that this is used merely for illustrative purposes. The number of buffers and flip-flops in a chain may vary from embodiment to embodiment. As more buffers and flip-flops are added to the chain, the wider the dynamic range of the TDC. However, as the dynamic range of the TDC increases, the probability that aliasing will occur also increases. Aliasing occurs when the TDC chain is unable to flush out the previously launched data.

An example of the pulse transitioning from 1 to 0 is shown with the edge falling at the flip-flop for bit 5. In one embodiment, the width of the pulse that is being captured by TDC 300 is representative of a voltage level of a supply voltage. In this embodiment, an increase in width of the pulse, causing a corresponding increase in the number of 1's in TDC 300, indicates that the voltage has increased. Otherwise, a decrease in the width of the pulse, causing a corresponding decrease in the number of 1's in buffer chain 300, indicates that the voltage has decreased (i.e., drooped). Corrective action (e.g., reducing a clock frequency) may be taken if a voltage droop greater than a threshold is detected.

In one embodiment, TDC 300 uses a buffer chain to capture the number of 1's in a pulse. However, if the capture frequency is too high, it is possible there could be more than one pulse edge within the window of TDC 300. This would cause aliasing errors when generating a sum of the number of 1's within the buffer chain. Accordingly, to prevent this type of scenario, anti-aliasing techniques are implemented to prevent errors when the frequency is too high for a particular TDC 300. This may occur in cases when a common TDC is used across a variety of applications with different supply voltages, operating conditions, clock frequencies, and so on.

Figure 4:
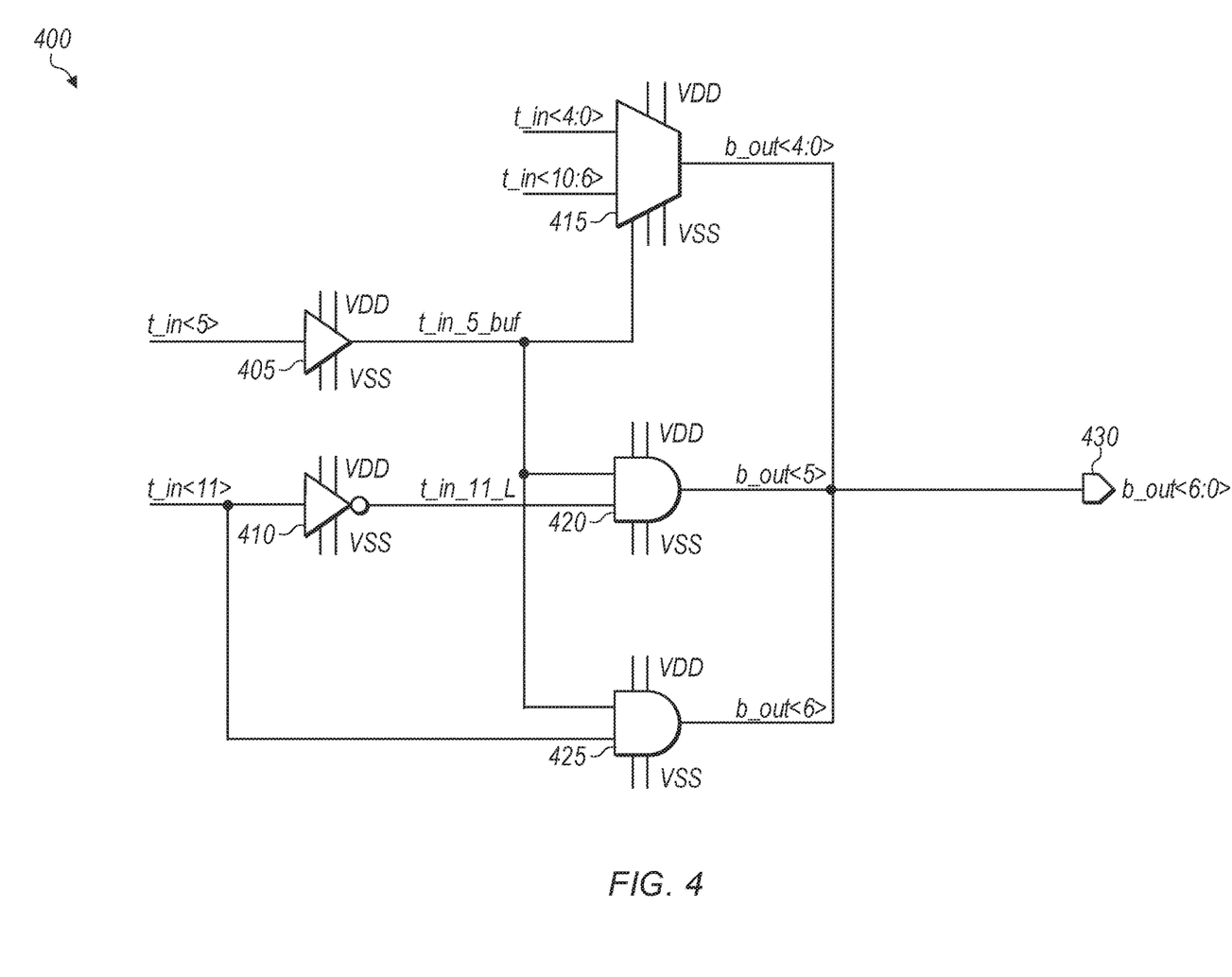
FIG. 4 is a circuit diagram of one embodiment of an anti-aliasing circuit for use with a time-to-digital converter.

Turning now to FIG. 4, a circuit diagram of one embodiment of an anti-aliasing circuit 400 for use with a TDC is shown. The example anti-aliasing circuit 400 assumes a 12-bit thermometer code input and a 7-bit binary code output. However, it should be understood that this is merely one example shown for illustrative purposes. In other embodiments, the thermometer code and/or the binary code may have other numbers of bits. In these other embodiments, corresponding adjustments to the signal widths and signal connections between circuit elements may be made to achieve a similar functionality to that shown for anti-aliasing circuit 400.

It is assumed that the buffer chain used by the TDC has a total of 64 bits for the example shown for anti-aliasing circuit 400. Accordingly, the midpoint of the buffer chain is 32 bits. It is also assumed that the bits t_in<5:0> are a measure of the number of 1's in the lower 32 bits of the buffer chain, while the bits t_in<11:6> are a measure of the number of 1's in the upper 32 bits of the buffer chain. For this embodiment, the 6$^{th}$ bit of the thermometer code (shown as t_in<5>) is coupled to the input of buffer 405, and the value of t_in<5> determines which input is selected by multiplexer (or mux) 415 to pass through to become the lower 5 bits of the binary code output (shown as b_out<4:0>). In one embodiment, if t_in<5> is equal to 1, this indicates that all of the lower 32 bits are 1's, and therefore, the failure point happens in the upper half of the buffer chain. In this case, all of the 1's in the entirety of the 64-bit buffer chain should be added together to generate the binary code output. Otherwise, if t_in<5> is equal to 0, this indicates that the failure point happens in the lower half of the buffer chain. In this case, only the 1's in the lower 32-bits of the buffer chain are added together to generate the binary code output.

The value of t_in<11> is coupled to inverter 410, and the output of inverter 410 (or "t_in_11_L") is coupled to one of the inputs of AND-gate 420. The output of buffer 405 (or "t_in_5_buf" is coupled to the other input of AND-gate 420. The output of AND-gate 420 becomes the $6^{th}$ bit of the binary code output (or "b_out<5>"). Also, the output of buffer 405 is coupled to a first input of AND-gate 425 while the MSB of the thermometer code (or "t_in<11>") is coupled to a second input of AND-gate 425. The output of AND-gate 425 becomes the $7^{th}$ bit (or the most significant bit (MSB)) of the binary code output (or "b_out<6>"). It should be understood that anti-aliasing circuit 400 is merely one example of an anti-aliasing circuit implementation. It is noted that in other embodiments, other arrangements of logic elements and circuit connections may be utilized to implement other anti-aliasing circuits similar to anti-aliasing circuit 400.

Figure 5:
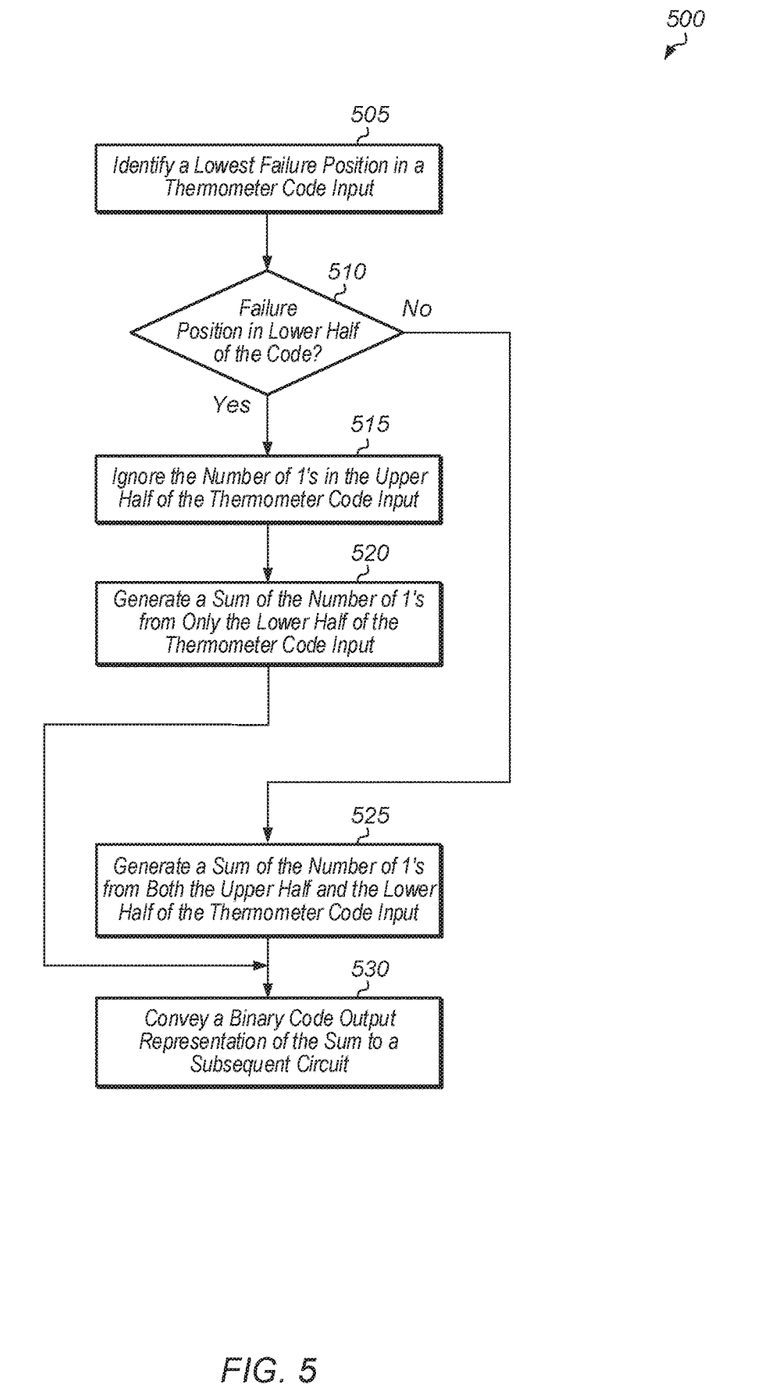
FIG. 5 is a flow diagram of one embodiment of a method for implementing an anti-aliasing technique for time-to-digital converters.

Referring now to FIG. 5, one embodiment of a method 500 for implementing an anti-aliasing technique for time-to-digital converters is shown. For purposes of discussion, the steps in this embodiment (and of FIGS. 6-7) are shown in sequential order. However, in other embodiments some steps may occur in a different order than shown, some steps may be performed concurrently, some steps may be combined with other steps, and some steps may be absent.

Control logic identifies a location of a lowest failure position (i.e., transition from 1 to 0) in a thermometer code input (block 505). If the lowest failure position is in the lower half of the code (conditional block 510, "yes" leg), then the control logic ignores the number of 1's in the upper half of the code (block 515). The control logic generates a sum of the number of 1's from only the lower half of the thermometer code input (block 520).

Otherwise, if the lowest failure position is in the upper half (conditional block 510, "no" leg), then a sum of the number of 1's from both the upper half and the lower half of the thermometer code input is generated (block 525). Then, a binary code output representation of the sum is conveyed to a subsequent circuit (block 530). After block 530, method 500 ends. In one embodiment, the binary code output representation of the sum is conveyed to a circuit which monitors for voltage droops in a voltage supply level. In other embodiments, the binary code output representation of the sum is conveyed to other types of circuits.

Figure 6:
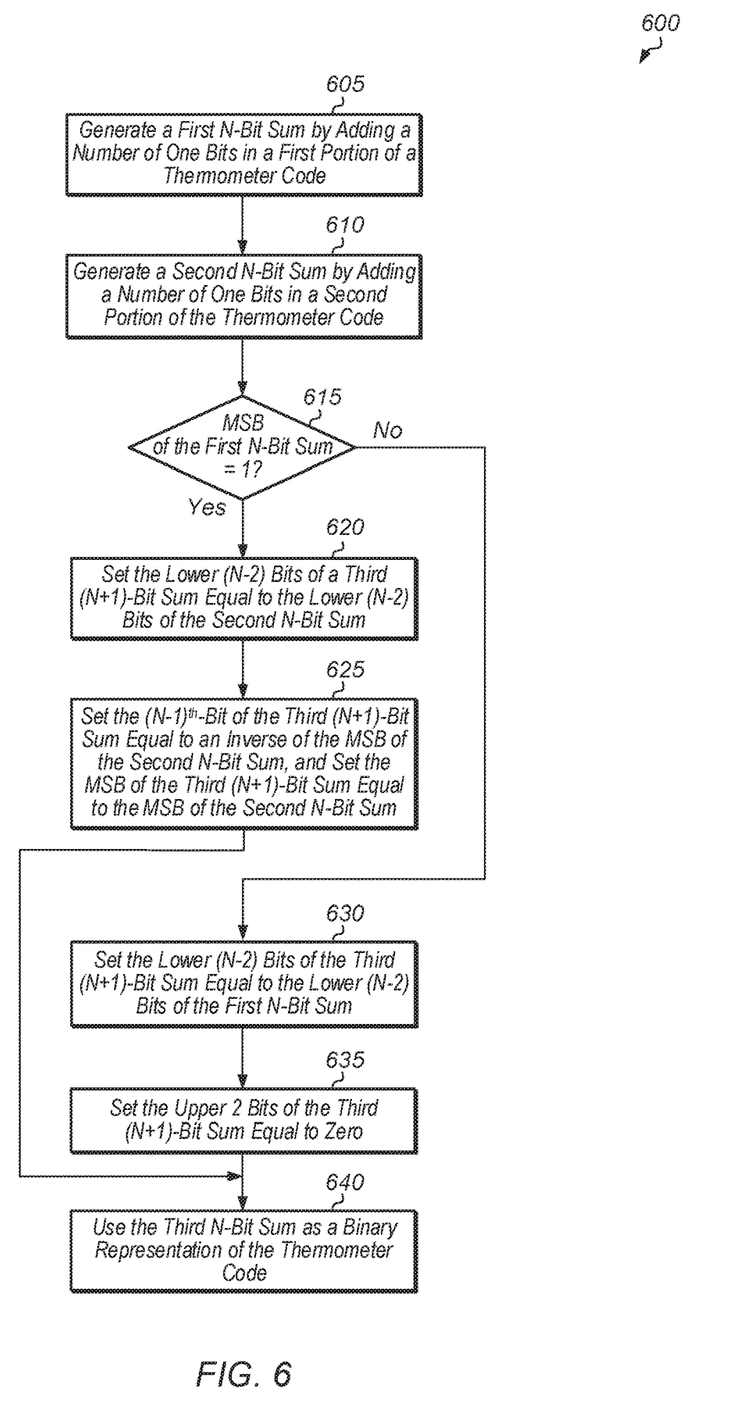
FIG. 6 is a flow diagram of one embodiment of a method for converting a thermometer code into a binary code.

Turning now to FIG. 6, one embodiment of a method 600 for converting a thermometer code into a binary code is shown. A first N-bit sum is generated by adding together a number of one bits in a first portion of a thermometer code (block 610). It is assumed for the purposes of this discussion that the first portion of the thermometer code is the least significant portion of the thermometer code. In other words, the first portion includes the most recently captured bits. A second N-bit sum is generated by adding together a number of one bits in a second portion of the thermometer code (block 615).

If the most significant bit (MSB) (i.e., the $(N-1)^{th}$-bit) of the first N-bit sum is equal to 1 (conditional block 615, "yes" leg), then the lower (N−2) bits of a third (N+1)-bit sum are set equal to the lower (N−2) bits of the second N-bit sum (block 620). Also, the $(N-1)^{th}$-bit of the third (N+1)-bit sum is set equal to the inverse of the MSB of the second N-bit sum, and the MSB of the third N+1-bit sum is set equal to the MSB of the second N-bit sum (block 625). Next, the third (N+1)-bit sum is used as a binary representation of the thermometer code (block 640). In other words, third (N+1)-bit sum represents the total number of valid one bits in the first and second portions of the buffer chain. After block 630, method 600 ends.

If the MSB of the first N-bit sum is equal to 0 (conditional block 615, "no" leg), then the lower (N−2) bits of the third (N+1)-bit sum are set equal to the lower (N−2) bits of the first N-bit sum (block 630). Also, the upper 2 bits of the third (N+1)-bit sum are set equal to zero (block 635). Then, the third (N+1)-bit sum is used as a binary representation of the thermometer code (block 640). By using method 600, aliasing is prevented from corrupting the output generated by the circuit.

Figure 7:
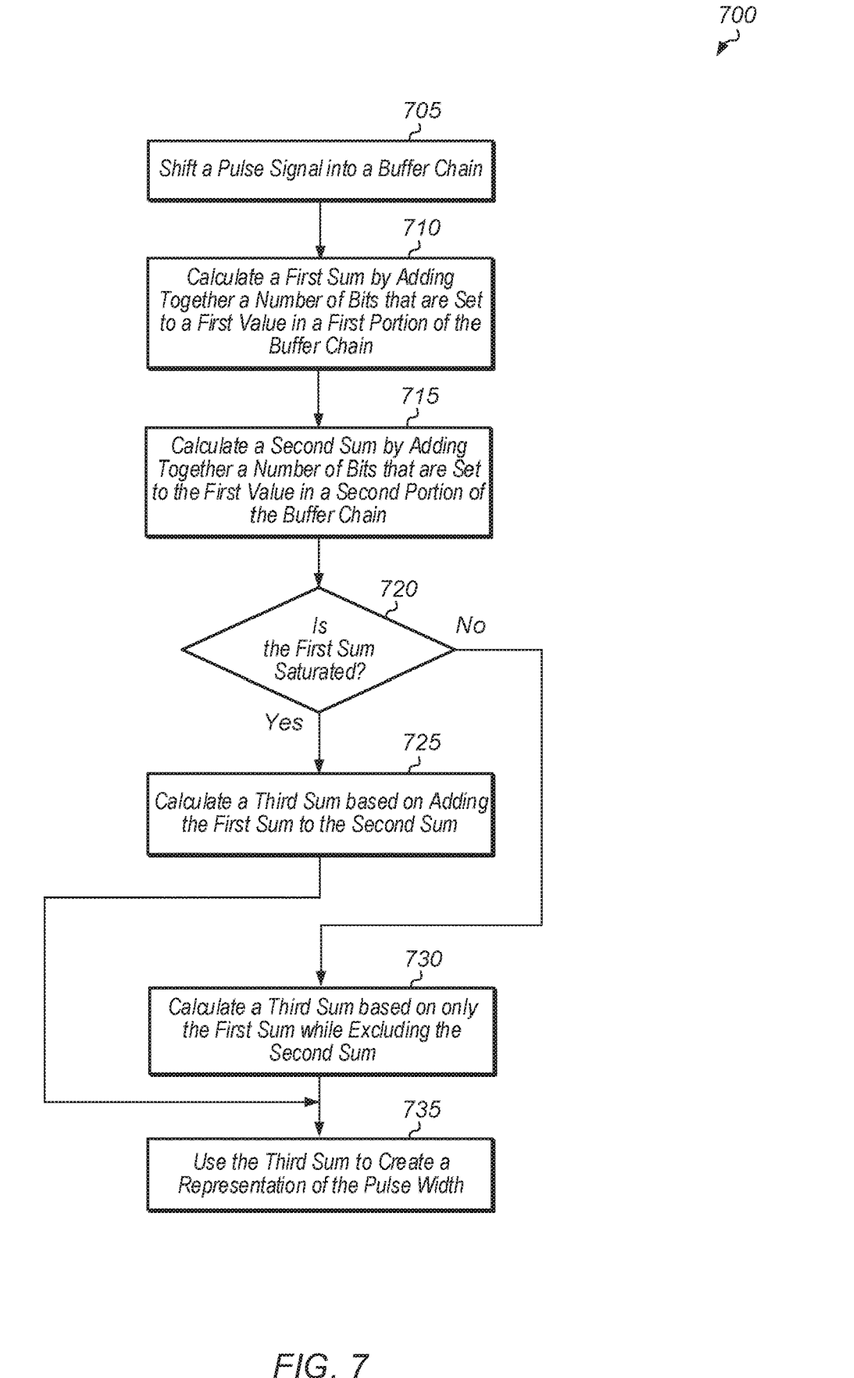
FIG. 7 is a flow diagram of one embodiment of a method for measuring a pulse width using an anti-aliasing technique.

Referring now to FIG. 7, one embodiment of a method 700 for measuring a pulse width using an anti-aliasing technique is shown. A pulse signal is shifted into a buffer chain (block 705). In one embodiment, the pulse signal is generated by a pulse generator and the width of the pulse signal is dependent on the voltage level of a supply voltage. In other embodiments, the pulse signal may be generated to track other metrics. A first sum is calculated by adding together a number of bits in a first portion that are set to a first value of the buffer chain (block 710). A second sum is calculated by adding together a number of bits that are set to the first value in a second portion of the buffer chain (block 715). In one embodiment, the first value is 1. It is assumed for the purposes of this discussion that bits pass through the first portion of the buffer chain before passing through the second portion of the buffer chain as the pulse shifts through the buffer chain. In other words, the first portion includes more recently captured bits with respect to the second portion.

If the first sum is saturated (i.e., reached a maximum value) (conditional block 720, "yes" leg), then a third sum is generated based on adding the first sum to the second sum (block 725). Next, the third sum is used to create a representation of the pulse width (block 735). After block 735, method 700 ends. If the first sum has not saturated (conditional block 720, "no" leg), then the third sum is calculated based on only the first sum while excluding the second sum (block 730). In other words, the second sum is ignored when the third sum is calculated. Then, the third sum is used to create a representation of the pulse width (block 730).

Figure 8:
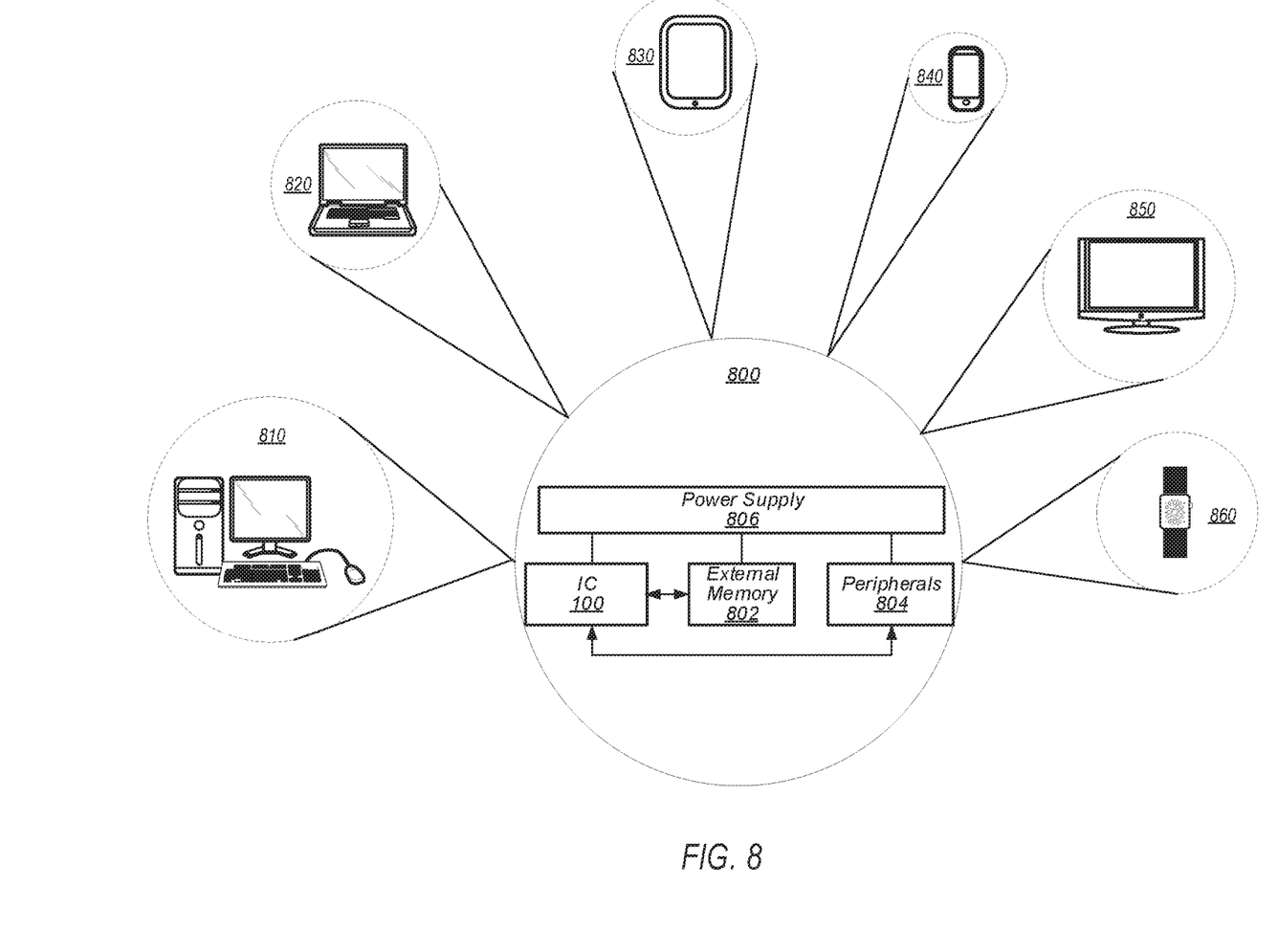
FIG. 8 is a block diagram of one embodiment of a system.

Turning now to FIG. 8, a block diagram of one embodiment of a system 800 is shown. As shown, system 800 may represent chip, circuitry, components, etc., of a desktop computer 810, laptop computer 820, tablet computer 830, cell or mobile phone 840, television 850 (or set top box configured to be coupled to a television), wrist watch or other wearable item 860, or otherwise. Other devices are possible and are contemplated. In the illustrated embodiment, the system 800 includes at least one instance of integrated circuit (IC) 100 (of FIG. 1) coupled to one or more peripherals 804 and the external memory 802. A power supply 806 is also provided which supplies the supply voltages to IC 100 as well as one or more supply voltages to the memory 802 and/or the peripherals 804. In various embodiments, power supply 806 may represent a battery (e.g., a rechargeable battery in a smart phone, laptop or tablet computer). In some embodiments, more than one instance of IC 100 may be included (and more than one external memory 802 may be included as well).

The memory 802 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 804 may include any desired circuitry, depending on the type of system 800. For example, in one embodiment, peripherals 804 may include devices for various types of wireless communication, such as wife, Bluetooth, cellular, global positioning system, etc. The peripherals 804 may also include additional storage, including RAM storage, solid state storage, or disk storage. The peripherals 804 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a thermometer-to-binary converter configured to:
      calculate a first sum by adding together a number of bits that are set to a first value in a first portion of a buffer chain;
      calculate a second sum by adding together a number of bits that are set to the first value in a second portion of the buffer chain;
      calculate a third sum based on:
         adding the first sum to the second sum responsive to the first sum being saturated;
         the first sum without including the second sum responsive to the first sum not being saturated; and
   control logic configured to perform a corrective action responsive to determining that the third sum is less than a given threshold.

2. The circuit as recited in claim 1, wherein the third sum represents a voltage level of a supply voltage, and wherein the correction action comprises causing a reduction in a frequency of a clock.

3. The circuit as recited in claim 1, wherein the first value is one.

4. The circuit as recited in claim 1, wherein the thermometer-to-binary converter comprises a multiplexer which selects from either a first group of bits of the first sum or a second group of bits of the second sum.

5. The circuit as recited in claim 4, wherein a select signal for the multiplexer is a most significant bit (MSB) of the first sum.

6. The circuit as recited in claim 5, wherein the thermometer-to-binary converter is further configured to set an upper two bits of the third sum equal to zero if the MSB of the first sum is equal to zero.

7. The circuit as recited in claim 6, thermometer-to-binary converter is further configured to set an MSB of the third sum equal to an MSB of the second sum if the MSB of the first sum is equal to one.

8. A method comprising:
   calculating a first sum by adding together a number of bits that are set to a first value in a first portion of a buffer chain;
   calculating a second sum by adding together a number of bits that are set to a first value in a second portion of the buffer chain;
   calculating a third sum based on adding the first sum to the second sum responsive to the first sum being saturated;
   calculating the third sum based on the first sum without including the second sum responsive to the first sum not being saturated; and
   performing a corrective action responsive to determining that the third sum is less than a given threshold.

9. The method as recited in claim 8, wherein the third sum represents a voltage level of a supply voltage, and wherein the correction action comprises causing a reduction in a frequency of a clock.

10. The method as recited in claim 8, wherein the first value is one.

11. The method as recited in claim 8, further comprising selecting, by a multiplexer, from either a first group of bits of the first sum or a second group of bits of the second sum.

12. The method as recited in claim 11, wherein a select signal for the multiplexer is a most significant bit (MSB) of the first sum.

13. The method as recited in claim 12, further comprising setting an upper two bits of the third sum equal to zero if the MSB of the first sum is equal to the zero.

14. The method as recited in claim 13, set an MSB of the third sum equal to an MSB of the second sum if the MSB of the first sum is equal to the one.

15. A system comprising:
   a pulse generator configured to generate a pulse with a width that is representative of a voltage level of a supply voltage;
   a buffer chain configured to receive the pulse;
   a thermometer-to-binary converter configured to:
      calculate a first sum by adding together a number of bits that are set to a first value in a first portion of the buffer chain;
      calculate a second sum by adding together a number of bits that are set to a first value in a second portion of the buffer chain;
      calculate a third sum based on adding the first sum to the second sum responsive to the first sum being saturated;
      calculate the third sum based on only the first sum responsive to the first sum not being saturated; and
   control logic configured to perform a corrective action responsive to determining that the third sum is less than a given threshold.

16. The system as recited in claim 15, wherein the third sum represents the voltage level of the supply voltage, and wherein the correction action comprises causing a reduction in a frequency of a clock.

17. The system as recited in claim 15, wherein the first value is one.

18. The system as recited in claim 15, wherein the thermometer-to-binary converter comprises a multiplexer which selects from either a first group of bits of the first sum or a second group of bits of the second sum.

19. The system as recited in claim 18, wherein a select signal for the multiplexer is a most significant bit (MSB) of the first sum.

20. The system as recited in claim 19, wherein the thermometer-to-binary converter is further configured to set an upper two bits of the third sum equal to zero if the MSB of the first sum is equal to zero.

* * * * *